United States Patent
Craig et al.

(10) Patent No.: US 8,539,404 B2
(45) Date of Patent: Sep. 17, 2013

(54) FUNCTIONAL SIMULATION REDUNDANCY REDUCTION BY STATE COMPARISON AND PRUNING

(75) Inventors: Jesse E. Craig, Cambridge, MA (US); Jason M. Norman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 13/241,496

(22) Filed: Sep. 23, 2011

(65) Prior Publication Data

US 2013/0080983 A1    Mar. 28, 2013

(51) Int. Cl.
G06F 9/455    (2006.01)
G06F 17/50    (2006.01)
G06F 11/22    (2006.01)

(52) U.S. Cl.
USPC .......................................... 716/106; 716/136

(58) Field of Classification Search
USPC ................................................ 716/106, 136
See application file for complete search history.

(56) References Cited

U.S. PATENT DOCUMENTS

| | | |
|---|---|---|
| 5,771,243 A | 6/1998 | Lee |
| 6,581,029 B1 | 6/2003 | Fischer |
| 6,865,525 B1 | 3/2005 | Zhong |
| 7,260,799 B2 * | 8/2007 | Baumgartner et al. ........ 716/107 |
| 7,315,973 B1 | 1/2008 | Wise |
| 7,392,170 B1 | 6/2008 | McGaughy et al. |
| 2005/0071034 A1 | 3/2005 | Mitrovic |
| 2011/0087478 A1 | 4/2011 | Tseng et al. |
| 2012/0159410 A1 * | 6/2012 | Jarrett ........................... 716/108 |
| 2012/0272197 A1 * | 10/2012 | Baumgartner et al. ........ 716/107 |

OTHER PUBLICATIONS

Mathew et al., "Identifying Redundancies Using Reduced Symbolic Simulation", IEEE, 1996, pp. 826-829.
IBM Corporation, "Method and System for Intelligent Random Simulation Base Techniques To Improve Inductive Redundancy Identification", Jan. 15, 2009, pp. 1-4.

* cited by examiner

Primary Examiner — Suresh Memula
(74) Attorney, Agent, or Firm — Gibb & Riley, LLC; Richard M. Kotulak, Esq.

(57) ABSTRACT

Methods and systems initiate a simulation of an integrated circuit design. The simulation produces data that will exist in latches of the integrated circuit design when a device manufactured according to the integrated circuit design is operating. The methods and systems evaluate same-state latches associated with different portions of the simulation. If two of the same-state latches have the same state, given the same inputs and environmental conditions, the method and systems terminate a first portion of the simulation associated with a first of the same-state latches, but allow a second portion of the simulation associated with a second of the same-state latches to proceed.

20 Claims, 9 Drawing Sheets

FUNCTIONAL SIMULATION REDUNDANCY REDUCTION BY STATE COMPARISON AND PRUNING

BACKGROUND

The embodiments herein relates to simulation of integrated circuit designs, and more specifically to methods and systems that (if two or more latches of interest have the same state, given the same inputs and environmental conditions) terminate a portion of a simulation associated with a one (or more) of such "same-state" latches and only allow a single portion of the simulation associated with another such "same-state" latch to proceed.

The growing complexity of function and gate counts found in modern digital semiconductor designs has made the verification of those designs the dominant cost of their development and implementation. Design teams rarely have the resources to exhaustively verify their designs, leading to a growing number of bugs not found during the verification process. This area of study includes popular techniques for verifying digital designs, directed random verification, and the diminishing returns which are often cited as the technique's greatest challenge. These diminishing returns are directly related to the inherent redundancy found in directed random verification and the disclosure below explores methods and systems of reducing this redundancy. Methods of optimization commonly create checkpoints at user selected, randomly controlled, decision points and explore the outcomes of these decision points.

SUMMARY

An exemplary method herein initiates a simulation of an integrated circuit design on a computerized simulator. The simulation produces data that will exist in latches of the integrated circuit design when a device manufactured according to the integrated circuit design is operating. The method evaluates various latches associated with different portions of the simulation using the computerized simulator. In order to distinguish these latches as being different or having different operating functions at different times, these latches are sometimes referred to herein as "same-state latches".

If two of these same-state latches have the same state, given the same inputs and environmental conditions, this indicates that there is a simulation redundancy that can be eliminated. Therefore, the methods herein adjust the simulator to terminate a first portion of the simulation associated with a one (or more) of the same-state latches and only allow a second portion of the simulation associated with the other same-state latches to proceed.

The same-state latches that are monitored are those that are considered interesting. More specifically, "interesting" latches are those that switch states less relatively infrequently (e.g., below a predetermined switching threshold). The "same state" within the latches occurs when the data is identical, or can also occur when the data values within the two same-state latches are within a predetermined percentage (or other range) of each other.

The different portions of the simulation that operate on the latches can comprise simulations that are being performed on the same portions of the integrated circuit design (potentially at different times) or can comprise simulations that are being performed simultaneously on different portions of the integrated circuit design.

Another exemplary method herein initiates a simulation of an integrated circuit design on a computerized simulator. The simulation produces data that will exist in latches of the integrated circuit design when a device manufactured according to the integrated circuit design is operating. This method monitors inputs provided to the integrated circuit design during the simulation using the computerized simulator, and also monitors environmental conditions of the integrated circuit design during the simulation (using the computerized simulator). This method also evaluates the same-state latches associated with the different portions of the simulation (using the computerized simulator). If at least two of the same-state latches have the same state, given the same the inputs and environmental conditions, this method adjusts the computerized simulator to terminate one or more portions of simulation associated with one or more of the same-state latches, and allows only a second portion of the simulation associated with another of the same-state latches to proceed.

An exemplary computerized simulator embodiment herein has a processor, a user interface operatively connected to the processor, a non-transitory computer storage medium storing simulation instructions, and an input/output port receiving an integrated circuit design. The processor executes the simulation instructions to initiate a simulation of the integrated circuit design provided through the input/output port. The simulation produces data that will exist in latches of the integrated circuit design when a device manufactured according to the integrated circuit design is operating. The processor executes the simulation instructions to evaluate same-state latches associated with different portions of the simulation. If two of the same-state latches have the same state given, the same inputs and environmental conditions, then the processor executes the simulation instructions to adjust the computerized simulator to terminate a first portion of the simulation associated with a first of the same-state latches, but allow a second portion of the simulation associated with a second of the same-state latches to proceed.

A non-transitory computer readable storage medium embodiment herein is readable by a computerized device. The non-transitory computer readable storage medium stores instructions executable by the computerized device to perform a method that initiates a simulation of an integrated circuit design. The simulation produces data that will exist in latches of the integrated circuit design when a device manufactured according to the integrated circuit design is operating. The method evaluates same-state latches associated with different portions of the simulation. If two of the same-state latches have the same state, given the same inputs and environmental conditions, the method terminates a first portion of the simulation associated with a first of the same-state latches, but allows a second portion of the simulation associated with a second of the same-state latches to proceed.

BRIEF DESCRIPTION OF THE DRAWINGS

The embodiments herein will be better understood from the following detailed description with reference to the drawings, which are not necessarily drawing to scale and in which.

DETAILED DESCRIPTION

As mentioned above, conventional methods of check pointing and simulating an integrated circuit design have a significant amount of redundancy. Although several simulations are forked from a decision point, it is possible that the destination state of several simulations converge to a state is similar or identical to another simulation.

Conventional function verification consists of thousands of nightly tests. The tests are long and consume valuable resources. Further, most device under test (DUT) states exercised are redundant. Examples of redundant states include where a reset is exercised in every test, training/configuration is performed to the same width many times, similar payloads are used in data packets, very few moments in each test are unique and/or interesting, duplicate packets are received while a link is in training, bad packets and good packets are received in the same cycle, etc.

Conventional systems attempt to address such situations by performing directed tests; however, doing so loses the benefit of random stimulus. Additionally, users can manually specify checkpoints (after reset for example); however, this is time-consuming and limited. Alternatively, systems can perform coverage directed stimulus, but this requires that manual stimulus bins must be created and this is close to directed testing and may loose randomly significant stimulus. Also, one can just run lots and lots of tests, but this is computationally expensive, slow, and the limited throughput may not reach coverage goals.

Traditional directed random verification suffers from a significant redundant simulation, and as can be understood, redundant simulation in a deterministic system is wasted compute time. Directed random verification is compute time limited, and a more efficient simulation that yields greater design coverage. By checkpointing key decisions during simulation, all outcomes of the decision can be explored without redundancy.

The systems and methods discussed herein reduce the state space by checking the destination state, and only start a simulation from a given point if no other simulations have reached that state. If two equivalent or similar states have been reached by two simulations, one of the simulations will be ended, since it would not be efficient to invest two threads exploring the downstream space.

Figure 1:
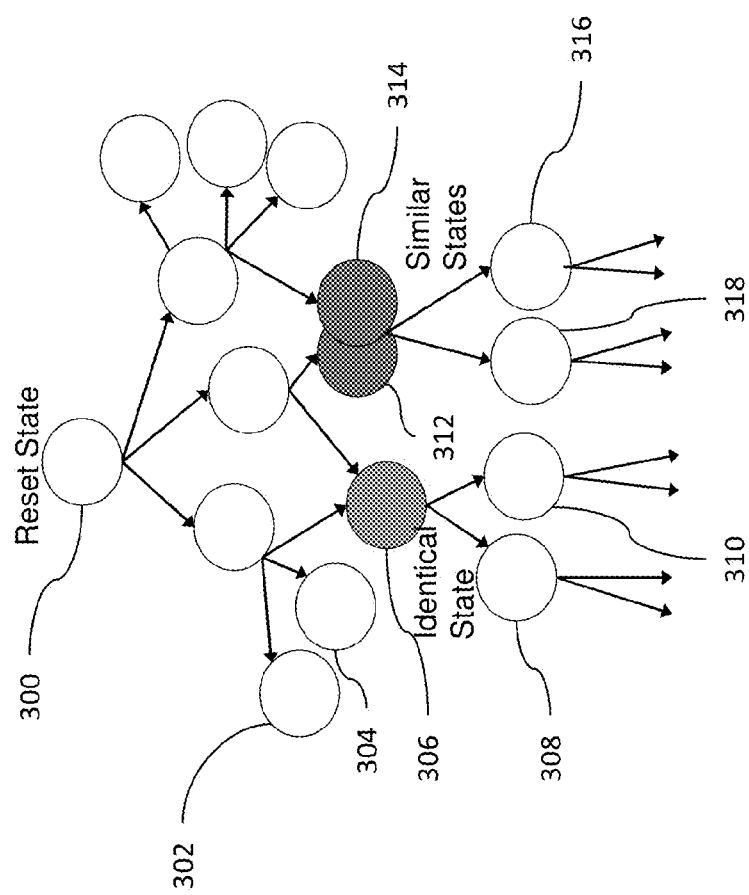
FIG. 1 is a schematic diagram illustrating different processing actions of a simulation according to embodiments herein.

The systems and methods discussed herein prevent a large amount of redundancy that occurs in traditional simulation, where the same test is rerun from the beginning many times in the hopes of hitting all scenarios eventually. When performing simulations, there exists the possibility that several forked simulations will reach identical states. For example, as shown in FIG. 1, item 300 represents a reset state (that may represent the start of the simulation, or the restart from a checkpoint). As is shown in FIG. 1, the simulation forks (represented by arrows) into multiple other simulation portions (represented by circles) from the reset state 300. Conventional systems will fork three threads (e.g., simulation portions 302, 304, and 306) exploring all possibilities for a given reset length (e.g., 5, 20, 100, etc.). However, the systems and methods herein prune some of the checkpoints if the "reset_length" is uninteresting and/or if the states of such simulation portions are the same.

For example, simulation portions 302, 304, and 306 may result in identical states. Items 314 and 312 may result in states that are similar enough to be processed like those portions having identical states. In order to reduce redundancy of performing identical fork simulations from all simulation portions 302, 304, and 306, the methods herein terminate any additional forks from two of the simulation portions 302 and 304, and only allow a simulation fork to continue from one of the simulation portions (item 306—which forks into simulation portions 308 and 310). Similarly, processing would be trimmed from either portion 312 or 314 such that only one of those portions forked to portions 316 and 318. This process reduces redundancy by pruning, or removing the states (items 302, 304, 314) that are identical to any that have already been explored. This frees up resources to work only on unique and interesting tests.

In addition to identical states, states that are 'similar' enough can also be pruned. Although these 'similar' states may be unique, they are not different enough to invest computing resource to continue exploring. Instead, tests that are more unique will get the valuable resource required to run them. Similar states are those where only the most important variables (latches, IOs in the DUT) have the same value as a state that has already been visited. Although the user can manually choose the most important variables, the methods and systems herein can automatically assign importance to a variable based upon how often it switches state (toggles). This leads to exploring tests where unique control signals are explored, and random decisions that vary frequently-changing data signals and counters will likely be ended, or pruned.

More specifically, the methods and systems herein identify identical states in the simulation when all latches, inputs, and environment variables are the same. Further, similar states can be classified as being identical. A similar state is one where the design state may be slightly different, but not different enough to explore it as a separate simulation. For example, in a series of 8 transfers, were one simulation has different data in one of the bytes the states can be considered similar.

The systems and methods herein can further automatically identify these states that are similar enough to be considered identical (for purposes herein) by looking at all state variables in the design (latches and inputs) and assign a priority level to each state variable. Further, states can be sorted by how unique each one is. The control signals therefore have a higher priority of differentiation. For example, in one embodiment, the methods and system herein determine, through simulation, which variables switch state the most. Those that switch more than some predetermined standard will be considered to have a low priority (to be unimportant), while others would be considered higher priority (important enough to be continued). Another alternative implementation is to manually assign which state variables are important.

In one example, on each checkpoint, the methods and system herein communicate the design state back to the parent process (simulation manager) and perform a dump of state variables and values. Only the high priority variables are given back to simulation manager. Then, the parent process is provided a command to compare states, and all high-priority states must exactly match a previously checkpointed state, to end the process. The parent process then tells the child thread whether to continue the simulation, or end it. The following table shows the state variables, their value, and priority.

| State Variable | New Value | Priority |
|---|---|---|
| LINKWIDTH | 16 | 100 |
| TS1_GT8 | 1 | 99 |
| DATARATE | 4'h3 | 80 |
| RESET_LENGTH | 20 | 70 |

If this simulation is not interesting (according to the previously established standards) the methods and systems herein will end it. The parent process will spawn another simulation at the last checkpoint in its place. Further, when starting a new simulation process, the methods and systems herein give it the table of state signals and their priority.

The embodiments herein could use a hash key for the high priority state variables, such as that shown below:
Simulation Checkpoint

| Priority | Variable | Value |
|---|---|---|
| 100 | LINKWIDTH | 16 |
| 99 | DATARATE | 4'h3 |
| 95 | TS1_GT8 | 1'b1 |
| 20 | ADDR_C | 16'h9263 |

The threshold (priority), where variables below the threshold will be ignored, determines how exhaustively to run. Further, this threshold can be user defined. Every new state/checkpoint is assigned to a hash value and the simulation process communicates the state hash for the current checkpoint to the parent. The hash does not include low priority variables (below an arbitrary threshold). The parent, in this case, will tell the child to end its simulation and then the parent will launch another simulation in its place, from another checkpoint.

Figure 2:
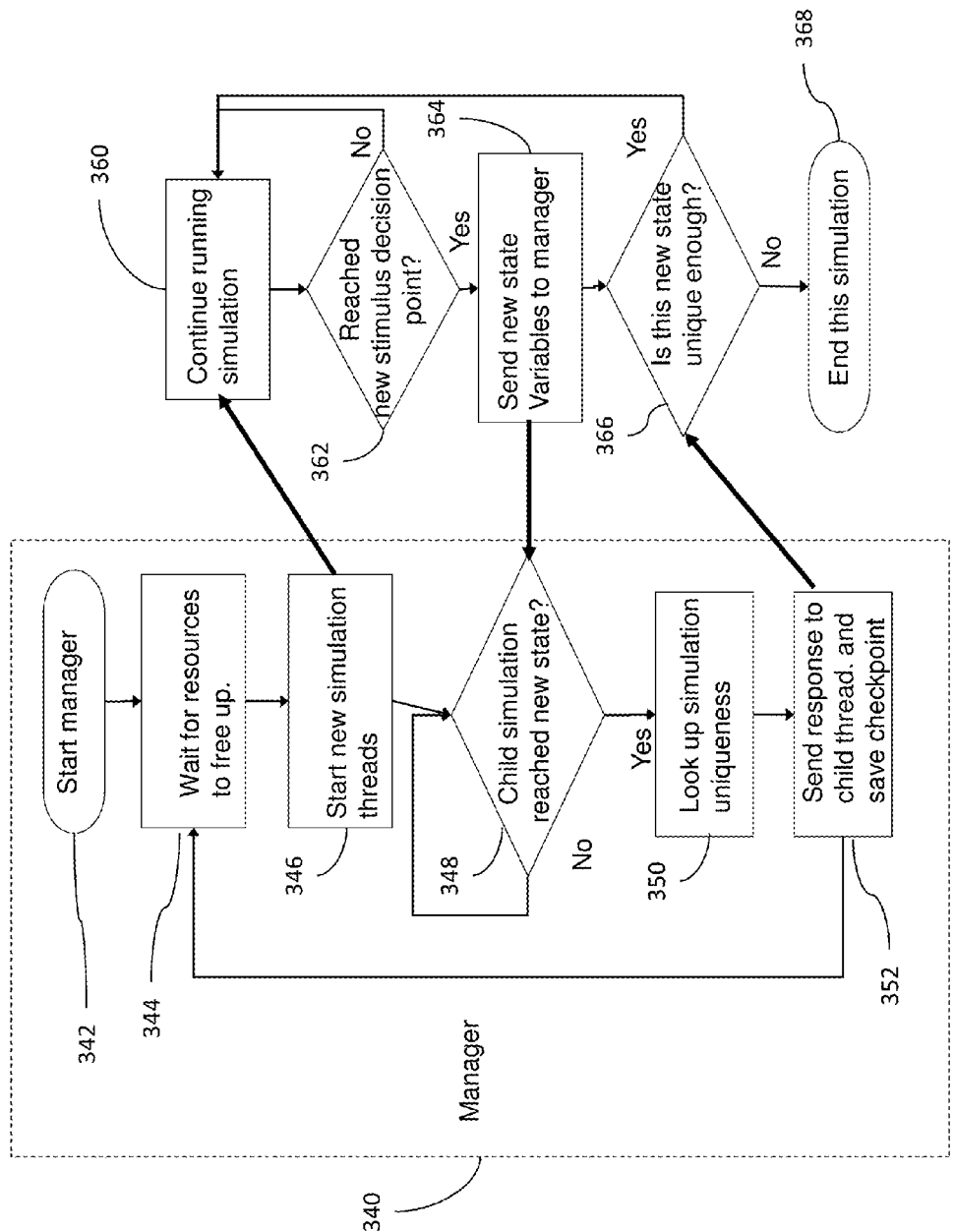
FIG. 2 is a flow diagram illustrating processing according to embodiments herein.

FIG. 2 is a flowchart illustrating this concept further. The manager portion of the flow is shown by the dashed-line box 340. In item 342 the manager starts and it waits for resources to free up in item 344. A new simulation starts in item 346. Item 348 determines whether the child simulation has reached a new state. When it does so, item 350 looks up the simulation uniqueness (interesting or not). Item 352 sends the response to the child thread and saves the checkpoint.

Item 360 continues running the simulation started in item 346 and such processing is continued until item 362 determines that a new stimulus decision point has been reached. At that point, item 364 sends the new state variables to the manager (to item 348). In item 366 if the new state is unique (interesting) enough it is continued by item 360. If not the simulation ends in item 368.

Therefore, as shown above, a system and method of behavioral simulation is provided herein that defines a simulation manager. The simulation manager maintains a list of running simulations and determines if a new simulation request is unique enough to continue. The simulation manager tests for relative levels of uniqueness based on a list of variables prioritized by toggle frequency, and a defined level of switching such that signals below this level (more frequent changes) are not important enough to pursue. A child simulation gives a request to the simulation manager, when a new stimulus decision is encountered and the simulation manager will fork a new simulation thread at a new state if it determines the state is unique enough.

Figure 3:
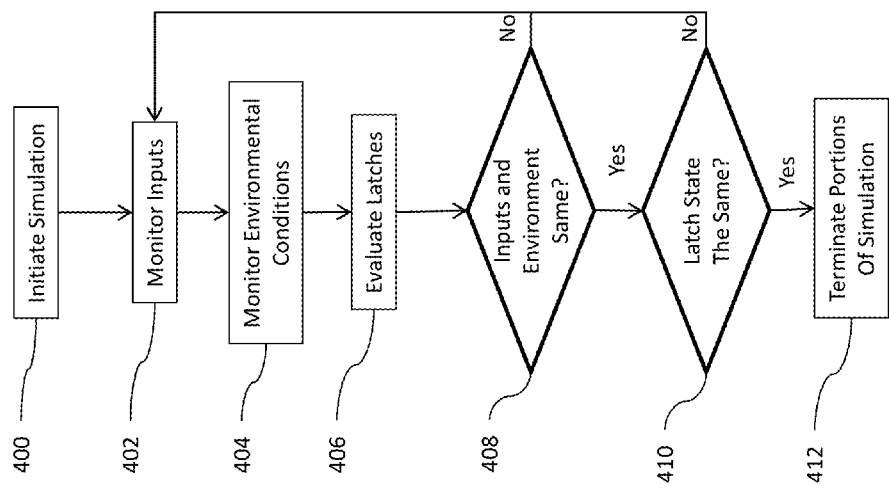
FIG. 3 is a flow diagram illustrating processing according to embodiments herein.

FIG. 3 illustrates one exemplary embodiment herein, which begins in item 400 by initiating a simulation of an integrated circuit design on a computerized simulator. The simulation produces data that will exist in latches of the integrated circuit design when a device manufactured according to the integrated circuit design is operating. This method also monitors inputs provided to the integrated circuit design during the simulation using the computerized simulator in item 402, and also monitors environmental conditions of the integrated circuit design during the simulation (again using the computerized simulator) in item 404.

In item 406, the method evaluates various latches associated with different portions of the simulation using the computerized simulator. In order to distinguish these latches as being different or having different operating functions at different times, these latches are sometimes referred to herein as "same-state latches."

In item 408, this exemplary method performs a comparison operation to see if the inputs and environmental conditions are the same among two or more same-state latches. Similarly, in item 410, this exemplary method performs a comparison operation to see if the state is the same within such latches.

The same-state latches that are monitored here are those that are considered interesting. More specifically, "interesting" latches are those that switch states less relatively infrequently (e.g., below a predetermined switching threshold). The "same state" within the latches occurs when the data is identical, or can also occur when the data values within the two same-state latches are within a predetermined percentage (or other range) of each other.

The different portions of the simulation that operate on the latches can comprise simulations that are being performed on the same portions of the integrated circuit design (potentially at different times) or can comprise simulations that are being performed simultaneously on different portions of the integrated circuit design.

If items 408 and 410 determine that two of these same-state latches have the same state, given the same inputs and environmental conditions, this indicates that there is a simulation redundancy that can be eliminated. Therefore, in item 412, the methods herein adjust the simulator to terminate a first portion of the simulation associated with a one (or more) of the same-state latches and only allow a second portion of the simulation associated with the other same-state latches to proceed.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or 2-D block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 4:
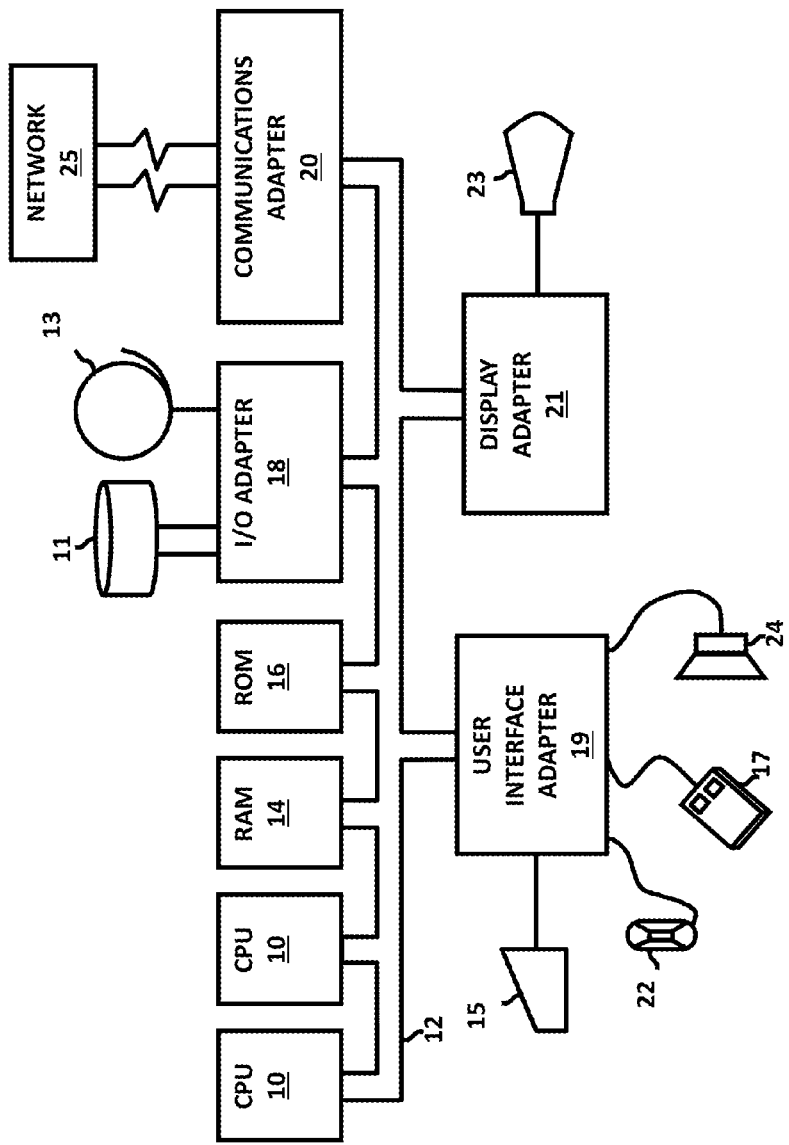
FIG. 4 is a schematic diagram illustrating an exemplary hardware environment that can be used to implement the embodiments herein.

A representative hardware environment for practicing the embodiments of the disclosure is depicted in FIG. 4. This schematic drawing illustrates a hardware configuration of an information handling/computer system in accordance with the embodiments of the disclosure. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the disclosure. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Thus, as shown in FIG. 4, a computerized machine embodiment for providing decision support for a command center herein includes an input/output port 18 receiving suggested actions from a rule-based decision support system. Also, a processor 10 is operatively connected to the input/output port 18. The processor 10 automatically determines parameters of the suggested actions to serve as input to a question-answering system operating on the computerized machine. The question-answering system automatically generates questions based on the parameters and then automatically searches a corpus of unstructured data to retrieve answers to the questions. Further, the question-answering system automatically provides impact values for each question and answer indicating the degree of impact each question and answer will have the questions and answers have on the suggested actions. Additionally, the graphic user interface 15, 17, 19, 21, 22-24 is operatively connected to the processor 10. The graphic user interface outputs the questions, the answers, and the impact/relevance values to the user.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

While it is understood that the process may be deployed by manually loading directly in the client, server and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will, select the proxy server code, determine on which computers to place the proxy servers' code, transmit the proxy server code, then install the proxy server code on the proxy computer. The process software will be transmitted to the proxy server then stored on the proxy server.

Figure 5:
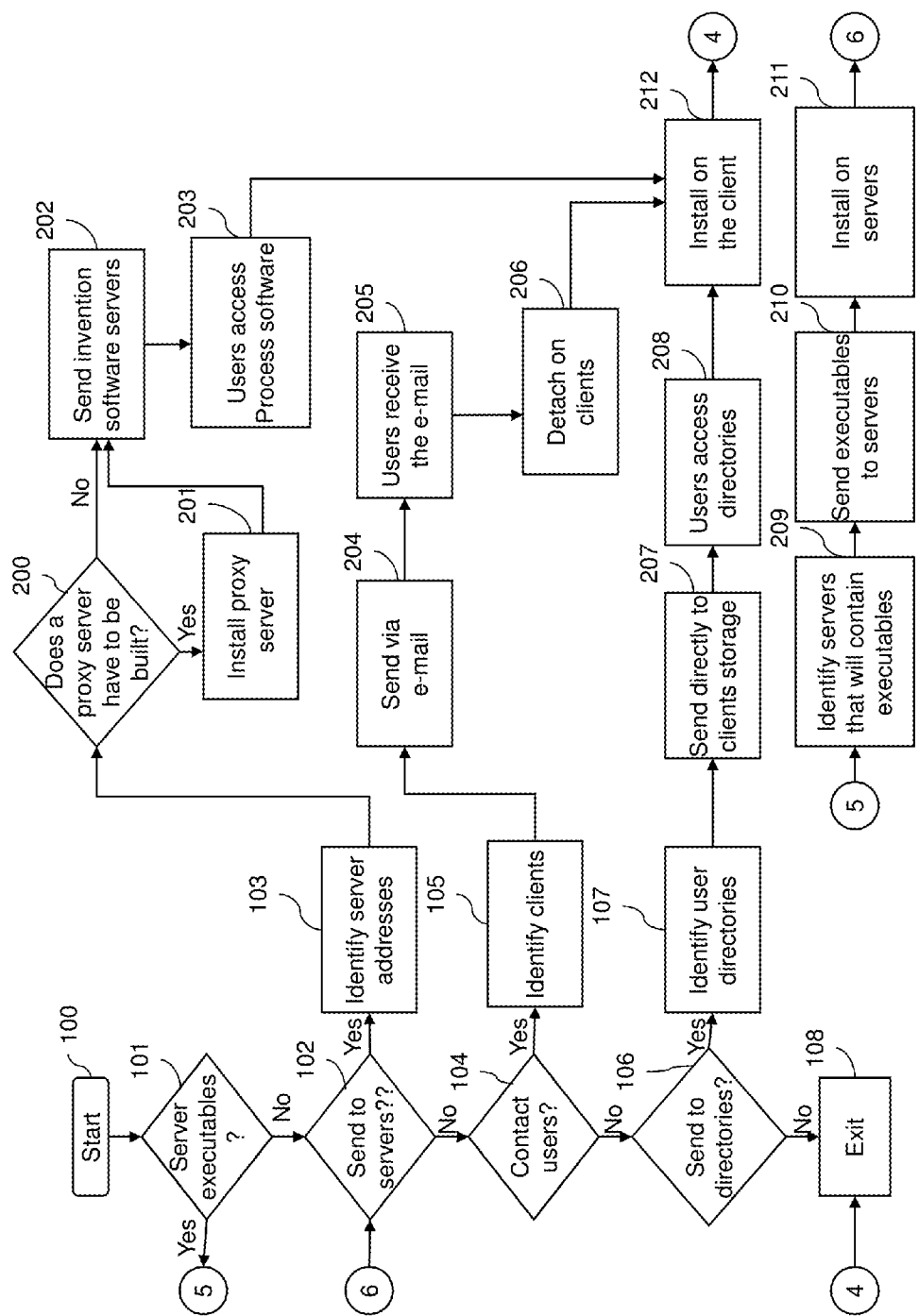
FIG. 5 is a schematic diagram of a deployment system according to embodiments herein.

As shown in FIG. 5, step 100 begins the deployment of the process software. The first thing is to determine if there are any programs that will reside on a server or servers when the process software is executed 101. If this is the case, then the servers that will contain the executables are identified 209. The process software for the server or servers is transferred directly to the servers' storage via FTP, or some other protocol, or by copying through the use of a shared file system 210. The process software is then installed on the servers 211.

Next, a determination is made on whether the process software is be deployed by having users access the process software on a server or servers 102. If the users are to access the process software on servers, then the server addresses that will store the process software are identified 103.

A determination is made if a proxy server is to be built 200 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required then the proxy server is installed 201. The process software is sent to the servers either via a protocol such as FTP or it is copied directly from the source files to the server files via file sharing 202. Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems 203. Another embodiment is to have the servers automatically copy the process software to each client and then run the installation program for the process software at each client computer. The user executes the program that installs the process software on his client computer 212, and then exits the process 108.

In step 104 a determination is made whether the process software is to be deployed by sending the process software to users via e-mail. The set of users where the process software will be deployed are identified together with the addresses of the user client computers 105. The process software is sent via e-mail to each of the users' client computers 204. The users then receive the e-mail 205 and then detach the process software from the e-mail to a directory on their client computers 206. The user executes the program that installs the process software on his client computer 212 then exits the process 108.

Lastly, a determination is made on whether the process software will be sent directly to user directories on their client computers 106. If so, the user directories are identified 107. The process software is transferred directly to the user's client computer directory 207. This can be done in several ways, such as, but not limited to, sharing of the file system directories and then copying from the sender's file system to the recipient user's file system or, alternatively using a transfer protocol such as File Transfer Protocol (FTP). The users access the directories on their client file systems in preparation for installing the process software 208. The user executes the program that installs the process software on his client computer 212 then exits the process 108.

The process software is integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely, parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6:
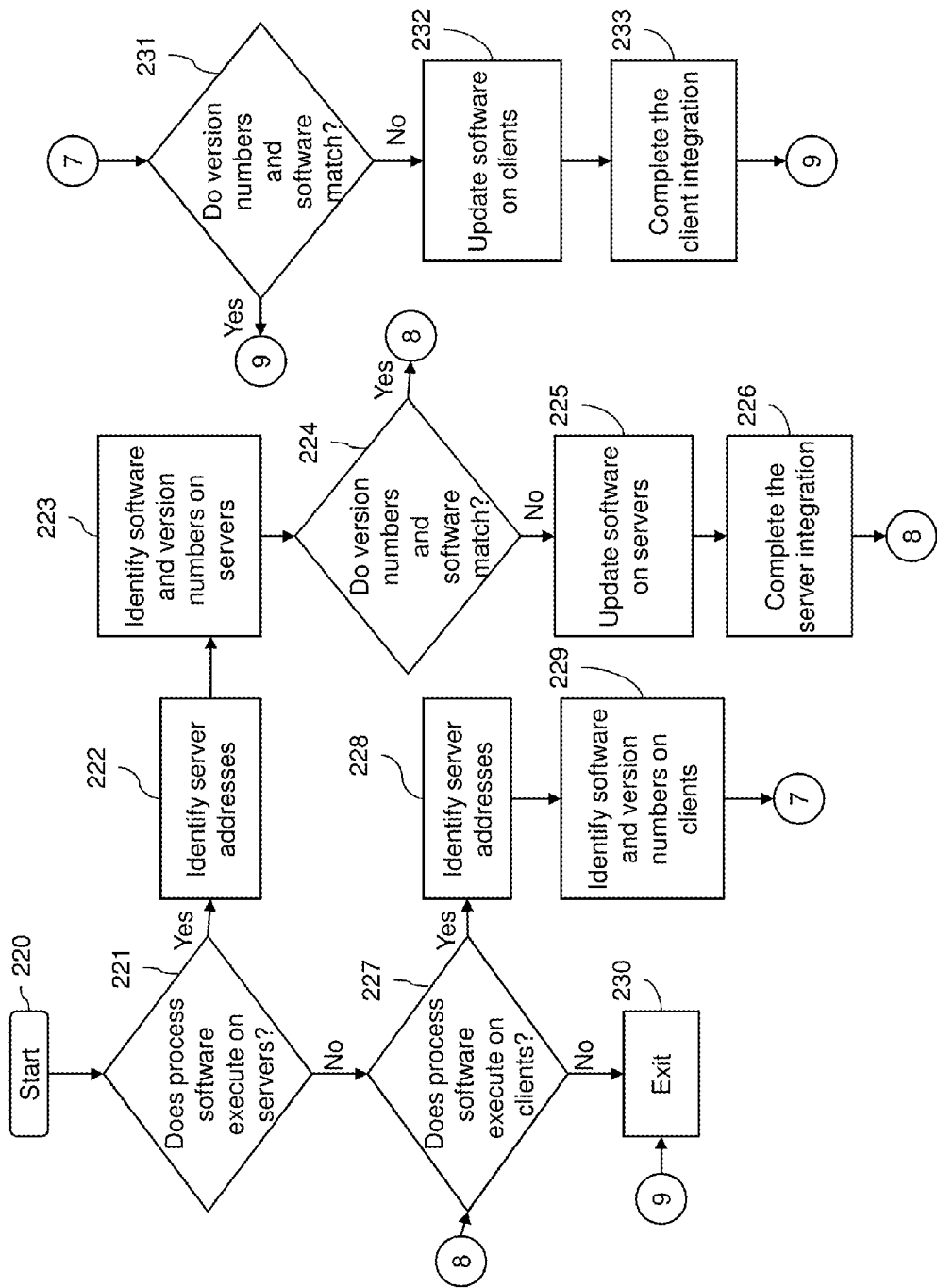
FIG. 6 is a schematic diagram of an integration system according to embodiments herein.

As shown in FIG. 6, step 220 begins the integration of the process software. The first thing is to determine if there are any process software programs that will execute on a server or servers 221. If this is not the case, then integration proceeds to 227. If this is the case, then the server addresses are identified 222. The servers are checked to see if they contain software that includes the operating system (OS), applications, and network operating systems (NOS), together with their version numbers, that have been tested with the process software 223. The servers are also checked to determine if there is any missing software that is required by the process software 223.

A determination is made if the version numbers match the version numbers of OS, applications and NOS that have been tested with the process software 224. If all of the versions match and there is no missing required software the integration continues in 227.

If one or more of the version numbers do not match, then the unmatched versions are updated on the server or servers with the correct versions 225. Additionally, if there is missing required software, then it is updated on the server or servers 225. The server integration is completed by installing the process software 226.

Step 227 which follows either 221, 224 or 226 determines if there are any programs of the process software that will execute on the clients. If no process software programs execute on the clients the integration proceeds to 230 and exits. If this not the case, then the client addresses are identified 228.

The clients are checked to see if they contain software that includes the operating system (OS), applications, and network operating systems (NOS), together with their version numbers, that have been tested with the process software 229. The clients are also checked to determine if there is any missing software that is required by the process software 229.

A determination is made as to whether the version numbers match the version numbers of OS, applications and NOS that have been tested with the process software 231. If all of the versions match and there is no missing required software, then the integration proceeds to 230 and exits.

If one or more of the version numbers do not match, then the unmatched versions are updated on the clients with the correct versions 232. In addition, if there is missing required software then it is updated on the clients 232. The client integration is completed by installing the process software on the clients 233. The integration proceeds to 230 and exits.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents but one measurement of use. Other measurements of use include, but are not limited to, network bandwidth, memory usage, storage usage, packet transfers, complete transactions etc. When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise, when other measurements of use such as network bandwidth, memory usage, storage usage, etc., approach a capacity so as to effect performance, additional network bandwidth, memory usage, storage etc., are added to share the workload. The measurements of use used for each service and customer are sent to a collecting server that sums the measurements of use for each customer for each service that was processed anywhere in the network of servers that provide the shared execution of the process software. The summed measurements of use units are periodically multiplied by unit costs, and the resulting total process software application service costs are alternatively sent to the customer and are indicated on a web site accessed by the customer which then remits payment to the service provider. In another embodiment, the service provider requests payment directly from a customer account at a banking or financial institution. In another embodiment, if the service provider is also a customer that uses the process software application, the payment owed to the service provider is reconciled to the payment owed by the service provider to minimize the transfer of payments.

The process software is shared, simultaneously serving multiple customers in a flexible, automated fashion. It is standardized, requiring little customization and it is scalable, providing capacity on demand in a pay-as-you-go model. The process software can be stored on a shared file system accessible from one or more servers. The process software is executed via transactions that contain data and server processing requests that use CPU units on the accessed server. CPU units are units of time such as minutes, seconds, hours on the central processor of the server. Additionally, the assessed server may make requests of other servers that require CPU units. CPU units are an example that represents but one measurement of use. Other measurements of use include, but are not limited to, network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to effect the performance of that server, other servers are accessed to increase the capacity and to share the workload. Likewise, when other measurements of use such as network bandwidth, memory usage, storage usage, etc. approach a capacity so as to effect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 7:
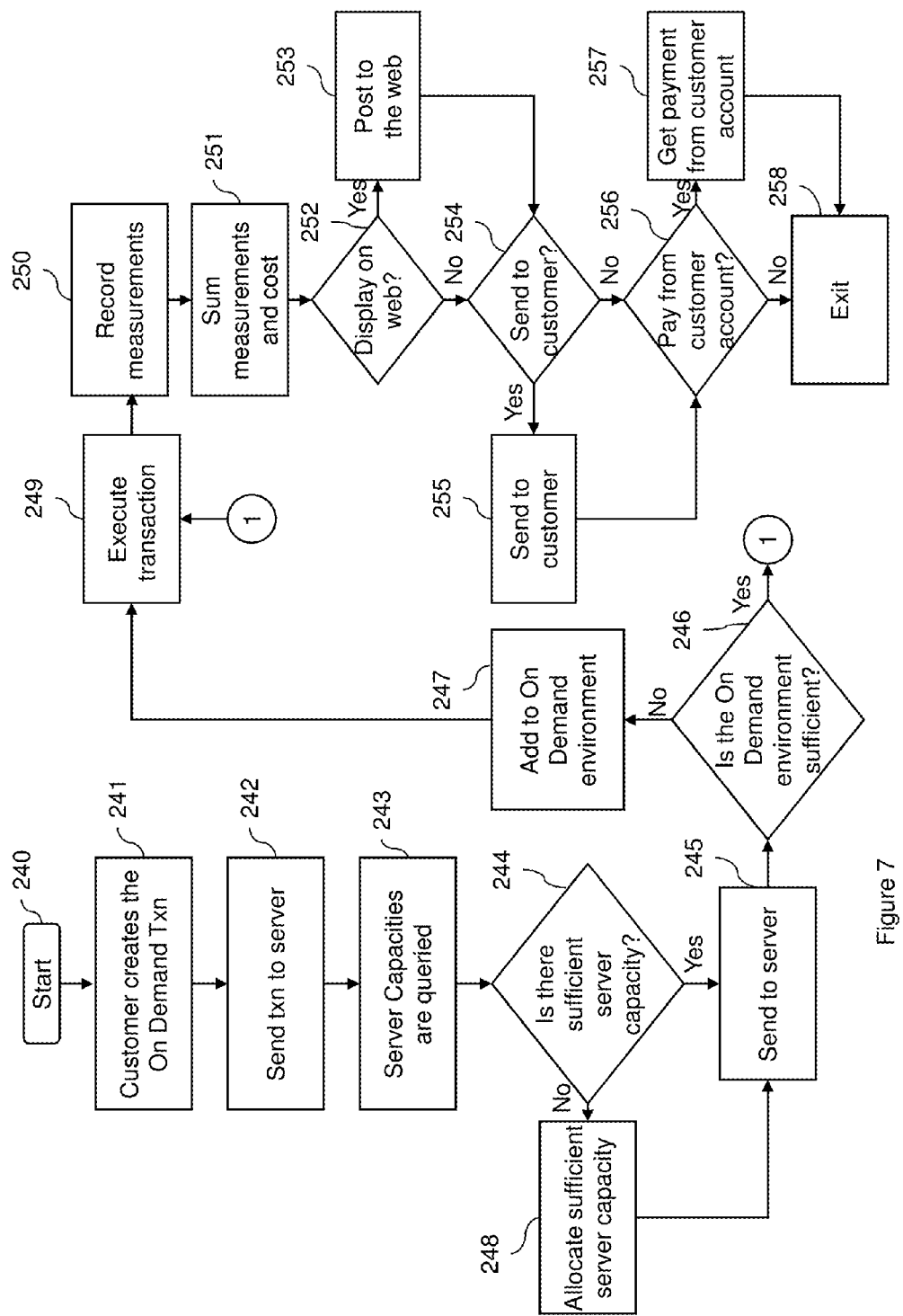
FIG. 7 is a schematic diagram of an on demand system according to embodiments herein.

As shown in FIG. 7, step 240 begins the On Demand process. A transaction is created that contains the unique customer identification, the requested service type and any service parameters that further specify the type of service 241. The transaction is then sent to the main server 242. In an On Demand environment the main server can initially be the only server, then, as capacity is consumed, other servers are added to the On Demand environment.

The server central processing unit (CPU) capacities in the On Demand environment are queried 243. The CPU requirement of the transaction is estimated, then the servers available CPU capacity in the On Demand environment are compared to the transaction CPU requirement to see if there is sufficient CPU available capacity in any server to process the transaction 244. If there is not sufficient server CPU available capacity, then additional server CPU capacity is allocated to process the transaction 248. If there was already sufficient Available CPU capacity then the transaction is sent to a selected server 245.

Before executing the transaction, a check is made of the remaining On Demand environment to determine if the environment has sufficient available capacity for processing the transaction. This environment capacity consists of such things as but not limited to network bandwidth, processor memory, storage etc. 246. If there is not sufficient available capacity, then capacity will be added to the On Demand environment 247. Next, the required software to process the transaction is accessed, loaded into memory, then the transaction is executed 249.

The usage measurements are recorded 250. The usage measurements consist of the portions of those functions in the On Demand environment that are used to process the transaction. The usage of such functions is, but not limited to, network bandwidth, processor memory, storage and CPU cycles are what is recorded. The usage measurements are summed, multiplied by unit costs and then recorded as a charge to the requesting customer 251. If the customer has requested that the On Demand costs be posted to a web site 252 then they are posted 253.

If the customer has requested that the On Demand costs be sent via e-mail to a customer address 254 then they are sent 255. If the customer has requested that the On Demand costs be paid directly from a customer account 256 then payment is received directly from the customer account 257. The last step is exit the On Demand process 258.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a company's multiple fixed sites over a public network such as the Internet.

The process software is transported over the VPN via tunneling which is the process of placing an entire packet within another packet and sending it over a network. The protocol of the outer packet is understood by the network and both points, called tunnel interfaces, where the packet enters and exits the network.

Figure 8:
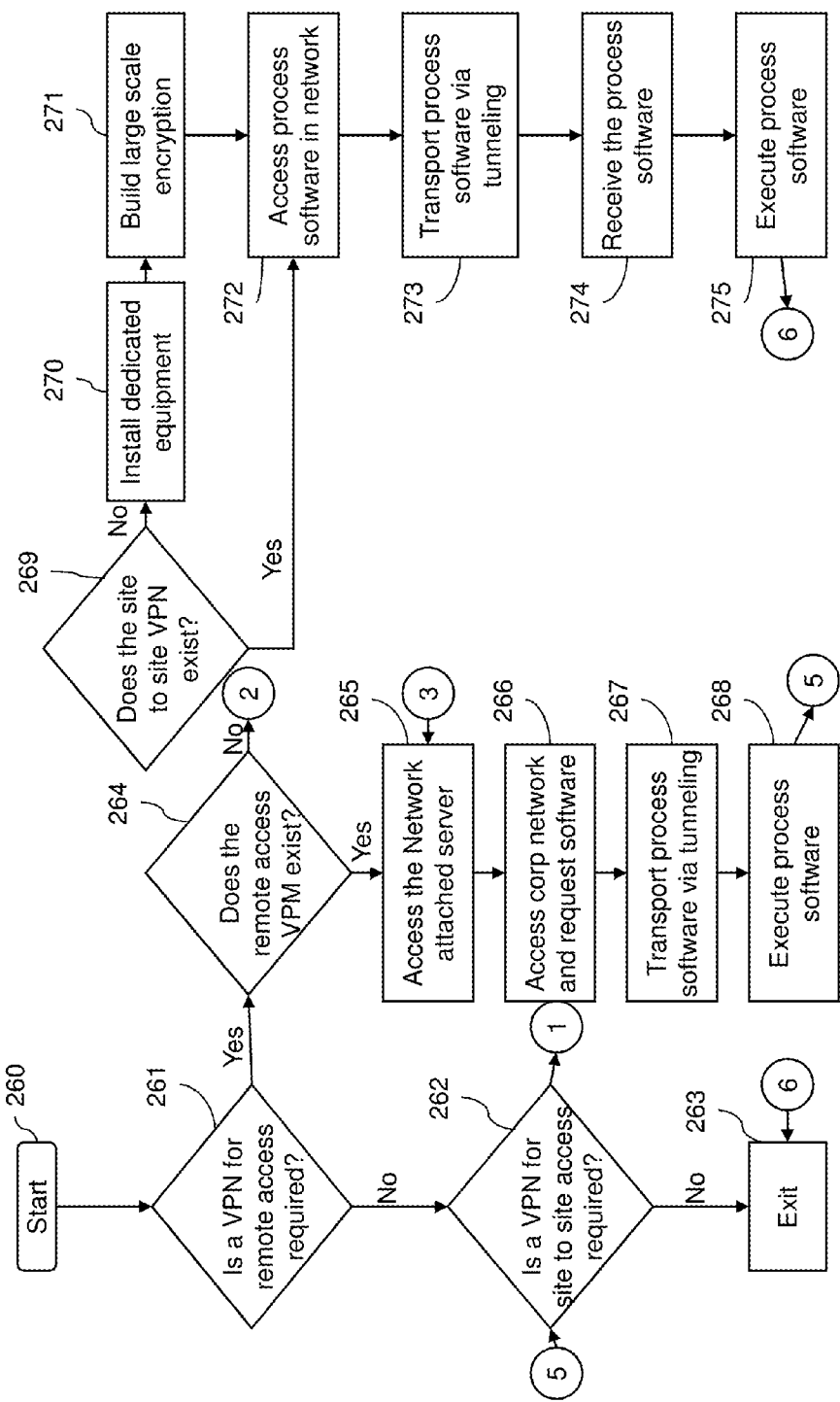
FIG. 8 is a schematic diagram of a virtual private network system according to embodiments herein.
Figure 9:
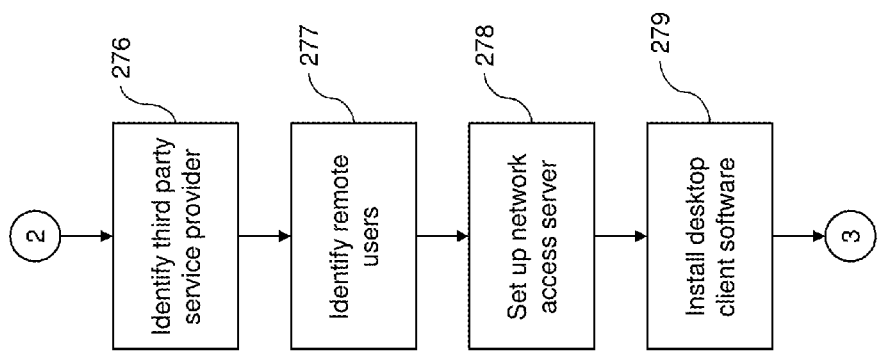
FIG. 9 is a schematic diagram of a virtual private network system according to embodiments herein.

As shown in FIGS. 8-9, step 260 begins the Virtual Private Network (VPN) process. A determination is made to see if a VPN for remote access is required 261. If it is not required, then proceed to 262. If it is required, then determine if the remote access VPN exists 264. If it does exist, then proceed to 265. Otherwise identify the third party provider that will provide the secure, encrypted connections between the company's private network and the company's remote users 276. The company's remote users are identified 277. The third party provider then sets up a network access server (NAS) 278 that allows the remote users to dial a toll free number or attach directly via a cable or DSL modem to access, download and install the desktop client software for the remote-access VPN 279.

After the remote access VPN has been built, or if it has been previously installed, the remote users can then access the process software by dialing into the NAS or attaching directly via a cable or DSL modem into the NAS 265. This allows entry into the corporate network where the process software is accessed 266. The process software is transported to the remote user's desktop over the network via tunneling. That is, the process software is divided into packets and each packet including the data and protocol is placed within another packet 267. When the process software arrives at the remote user's desktop, it is removed from the packets, reconstituted and then is executed on the remote users desktop 268.

A determination is made to see if a VPN for site to site access is required 262. If it is not required, then proceed to exit the process 263. Otherwise, determine if the site to site VPN exists 269. If it does exist, then proceed to 272. Otherwise, install the dedicated equipment required to establish a site to site VPN 270. Then, build the large scale encryption into the VPN 271.

After the site to site VPN has been built or if it had been previously established, the users access the process software via the VPN 272. The process software is transported to the site users over the network via tunneling 273. That is, the process software is divided into packets and each packet including the data and protocol is placed within another packet 274. When the process software arrives at the remote user's desktop, it is removed from the packets, reconstituted and is executed on the site users desktop 275. Proceed to exit the process 263.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
    initiating a simulation of an integrated circuit design on a computerized simulator, said simulation producing data that will exist in latches of said integrated circuit design when a device manufactured according to said integrated circuit design is operating;
    evaluating same-state latches associated with different portions of said simulation using said computerized simulator, said same-state latches switching less than a predetermined threshold; and
    if two of said same-state latches have the same state given the same inputs and environmental conditions, adjusting said computerized simulator to terminate a first portion of said simulation associated with a first of said same-state latches and allowing a second portion of said simulation associated with a second of said same-state latches to proceed.

2. The method according to claim 1, said different portions of said simulation comprising one of:
    simulations being performed on the same portions of said integrated circuit design at different times; and
    simulations being performed simultaneously on different portions of said integrated circuit design.

3. The method according to claim 1, said same-state latches comprising control latches.

4. The method according to claim 1, said same state comprising data values within said two of said same-state latches being within a predetermined percentage of each other.

5. The method according to claim 1, said computerized simulator comprising a particular simulator machine.

6. A method comprising:
    initiating a simulation of an integrated circuit design on a computerized simulator, said simulation producing data that will exist in latches of said integrated circuit design when a device manufactured according to said integrated circuit design is operating;
    monitoring inputs provided to said integrated circuit design during said simulation using said computerized simulator;
    monitoring environmental conditions of said integrated circuit design during said simulation using said computerized simulator;
    evaluating same-state latches associated with different portions of said simulation using said computerized simulator; and
    if at least two of said same-state latches have the same state given the same said inputs and said environmental conditions, adjusting said computerized simulator to terminate at least a first portion of simulation associated with at least a first of said same-state latches and allowing a second portion of said simulation associated with a second of said same-state latches to proceed.

7. The method according to claim 6, said different portions of said simulation comprising one of:
    simulations being performed on the same portions of said integrated circuit design at different times; and
    simulations being performed simultaneously on different portions of said integrated circuit design.

8. The method according to claim 6, said same-state latches comprising control latches that switch states less than a predetermined threshold.

9. The method according to claim 6, said same state comprising data values within said at least two of said same-state latches being within a predetermined percentage of each other.

10. The method according to claim 6, said computerized simulator comprising a particular simulator machine.

11. A computerized simulator comprising:
    a processor;
    a user interface operatively connected to said processor;
    a non-transitory computer storage medium operatively connected to said processor, said non-transitory computer storage medium storing simulation instructions; and
    an input/output port operatively connected to said processor, said input/output port receiving an integrated circuit design,
    said processor executing said simulation instructions to initiate a simulation of said integrated circuit design provided through said input/output port, said simulation producing data that will exist in latches of said integrated circuit design when a device manufactured according to said integrated circuit design is operating;
    said processor executing said simulation instructions to evaluate same-state latches associated with different portions of said simulation, said same-state latches switching less than a predetermined threshold; and
    if two of said same-state latches have the same state given the same inputs and environmental conditions, said processor executing said simulation instructions to adjust said computerized simulator to terminate a first portion of said simulation associated with a first of said same-state latches and allowing a second portion of said simulation associated with a second of said same-state latches to proceed.

12. The computerized simulator according to claim 11, said different portions of said simulation comprising one of:
    simulations being performed on the same portions of said integrated circuit design at different times; and
    simulations being performed simultaneously on different portions of said integrated circuit design.

13. The computerized simulator according to claim 11, said same-state latches comprising control latches.

14. The computerized simulator according to claim 11, said same state comprising data values within said two of said same-state latches being within a predetermined percentage of each other.

15. The computerized simulator according to claim 11, said computerized simulator comprising a particular simulator machine.

16. A tangible computer readable storage medium being readable by a computerized device, said tangible computer readable storage medium storing instructions executable by said computerized device to perform a method comprising:

initiating a simulation of an integrated circuit design, said simulation producing data that will exist in latches of said integrated circuit design when a device manufactured according to said integrated circuit design is operating;

evaluating same-state latches associated with different portions of said simulation, said same-state latches switching less than a predetermined threshold; and if two of said same-state latches have the same state given the same inputs and environmental conditions, terminating a first portion of said simulation associated with a first of said same-state latches and allowing a second portion of said simulation associated with a second of said same-state latches to proceed.

17. The tangible computer readable storage medium according to claim 16, said different portions of said simulation comprising one of:

simulations being performed on the same portions of said integrated circuit design at different times; and simulations being performed simultaneously on different portions of said integrated circuit design.

18. The tangible computer readable storage medium according to claim 16, said same state latches comprising control latches that switch states less than a predetermined threshold.

19. The tangible computer readable storage medium according to claim 16, said same state comprising data values within said two of said same-state latches being within a predetermined percentage of each other.

20. The tangible computer readable storage medium according to claim 16, said computerized device comprising a particular simulator machine.

* * * * *